United States Patent
Franz et al.

(10) Patent No.: US 8,649,171 B2
(45) Date of Patent: Feb. 11, 2014

(54) MIXED-FLOW DUCTED FAN

(75) Inventors: John P Franz, Houston, TX (US); Wade D. Vinson, Magnolia, TX (US); Yousef Jarrah, Tuscon, AZ (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 0 days.

(21) Appl. No.: 13/387,175

(22) PCT Filed: Feb. 26, 2010

(86) PCT No.: PCT/US2010/025625
§ 371 (c)(1),
(2), (4) Date: Jan. 26, 2012

(87) PCT Pub. No.: WO2011/106020
PCT Pub. Date: Sep. 1, 2011

(65) Prior Publication Data
US 2012/0307440 A1 Dec. 6, 2012

(51) Int. Cl.
*G06F 1/20* (2006.01)
*H05K 7/20* (2006.01)
(52) U.S. Cl.
USPC ...................................... 361/679.48; 361/695
(58) Field of Classification Search
USPC ............................ 415/207, 218.1, 219.1, 220
See application file for complete search history.

(56) References Cited

U.S. PATENT DOCUMENTS

| | | | | |
|---|---|---|---|---|
| 3,858,644 A | * | 1/1975 | Beck et al. | 165/51 |
| 3,872,916 A | * | 3/1975 | Beck | 165/51 |
| 4,167,376 A | * | 9/1979 | Papst | 417/354 |
| 4,173,995 A | * | 11/1979 | Beck | 165/51 |
| 4,221,546 A | * | 9/1980 | Papst et al. | 417/354 |
| 5,385,447 A | * | 1/1995 | Geister | 415/220 |
| 5,803,709 A | * | 9/1998 | Matthews et al. | 415/182.1 |
| 6,814,542 B2 | * | 11/2004 | Marlander et al. | 415/219.1 |
| 6,935,843 B2 | | 8/2005 | Wang | |
| 7,256,995 B2 | * | 8/2007 | Wrycraft et al. | 361/695 |
| 7,443,671 B2 | * | 10/2008 | Vinson et al. | 361/695 |
| 7,447,019 B2 | * | 11/2008 | Vinson et al. | 361/695 |
| 7,470,108 B2 | * | 12/2008 | Watanabe et al. | 415/207 |
| 7,978,469 B2 | * | 7/2011 | Tsakanikas | 361/690 |
| 8,052,386 B1 | * | 11/2011 | Fitzpatrick et al. | 415/218.1 |
| 8,117,012 B2 | * | 2/2012 | Vinson et al. | 703/1 |
| 2007/0097623 A1 | | 5/2007 | Vinson et al. | |
| 2007/0264119 A1 | | 11/2007 | Lin | |
| 2009/0009962 A1 | | 1/2009 | Vinson et al. | |

* cited by examiner

Primary Examiner — Robert J Hoffberg

(57) ABSTRACT

In accordance with at least some embodiments, a computer system includes an enclosure (202) configured to hold at least one resource unit (204). The computer system also comprises a plurality of mixed-flow ducted fans units (400) selectively attached to the enclosure (202). Each mixed-flow ducted fan unit (400) comprises a duct (102) having an intake diameter, a bellmouth diameter, and an exhaust diameter. The bellmouth diameter is less than the intake diameter and the exhaust diameter.

13 Claims, 11 Drawing Sheets

MIXED-FLOW DUCTED FAN

BACKGROUND

Some electronic devices reach high levels of back pressure within the chassis or enclosure. For example, in a server enclosure with multiple compute nodes, these high levels of back pressure may be reached. Fans are often implemented to move air within electronic devices. However, existing fan designs are often inadequate or inefficient in an electronic device with high levels of back pressure.

BRIEF DESCRIPTION OF THE DRAWINGS

For a detailed description of exemplary embodiments of the invention, reference will now be made to the accompanying drawings in which.

NOTATION AND NOMENCLATURE

Certain terms are used throughout the following description and claims to refer to particular system components. As one skilled in the art will appreciate, computer companies may refer to a component by different names. This document does not intend to distinguish between components that differ in name but not function. In the following discussion and in the claims, the terms "including" and "comprising" are used in an open-ended fashion, and thus should be interpreted to mean "including, but not limited to . . . ." Also, the term "couple" or "couples" is intended to mean either an indirect, direct, optical or wireless electrical connection. Thus, if a first device couples to a second device, that connection may be through a direct electrical connection, through an indirect electrical connection via other devices and connections, through an optical electrical connection, or through a wireless electrical connection.

DETAILED DESCRIPTION

The following discussion is directed to various embodiments of the invention. Although one or more of these embodiments may be preferred, the embodiments disclosed should not be interpreted, or otherwise used, as limiting the scope of the disclosure, including the claims. In addition, one skilled in the art will understand that the following description has broad application, and the discussion of any embodiment is meant only to be exemplary of that embodiment, and not intended to intimate that the scope of the disclosure, including the claims, is limited to that embodiment.

In accordance with embodiments of the disclosure, a mixed-flow ducted fan comprises a duct having an intake diameter, a bellmouth diameter and an exhaust diameter, where the bellmouth diameter is less than the intake diameter and the exhaust diameter. An impeller is inset within the duct between the bellmouth diameter and the exhaust diameter. The mixed-flow ducted fan may be understood to be a ducted "mixed-flow" vane-axial fan, where "mixed-flow" refers to radial airflow and axial airflow. The mixed-flow ducted fan may be implemented with a multi-node server enclosure or other electronic devices that internally reach high back-pressure levels. In some embodiments, the mixed-flow ducted fan is implemented as a mixed-flow ducted fan unit that is compatible with a fan bay for a multi-node server enclosure or other electronic device.

Figure 1:
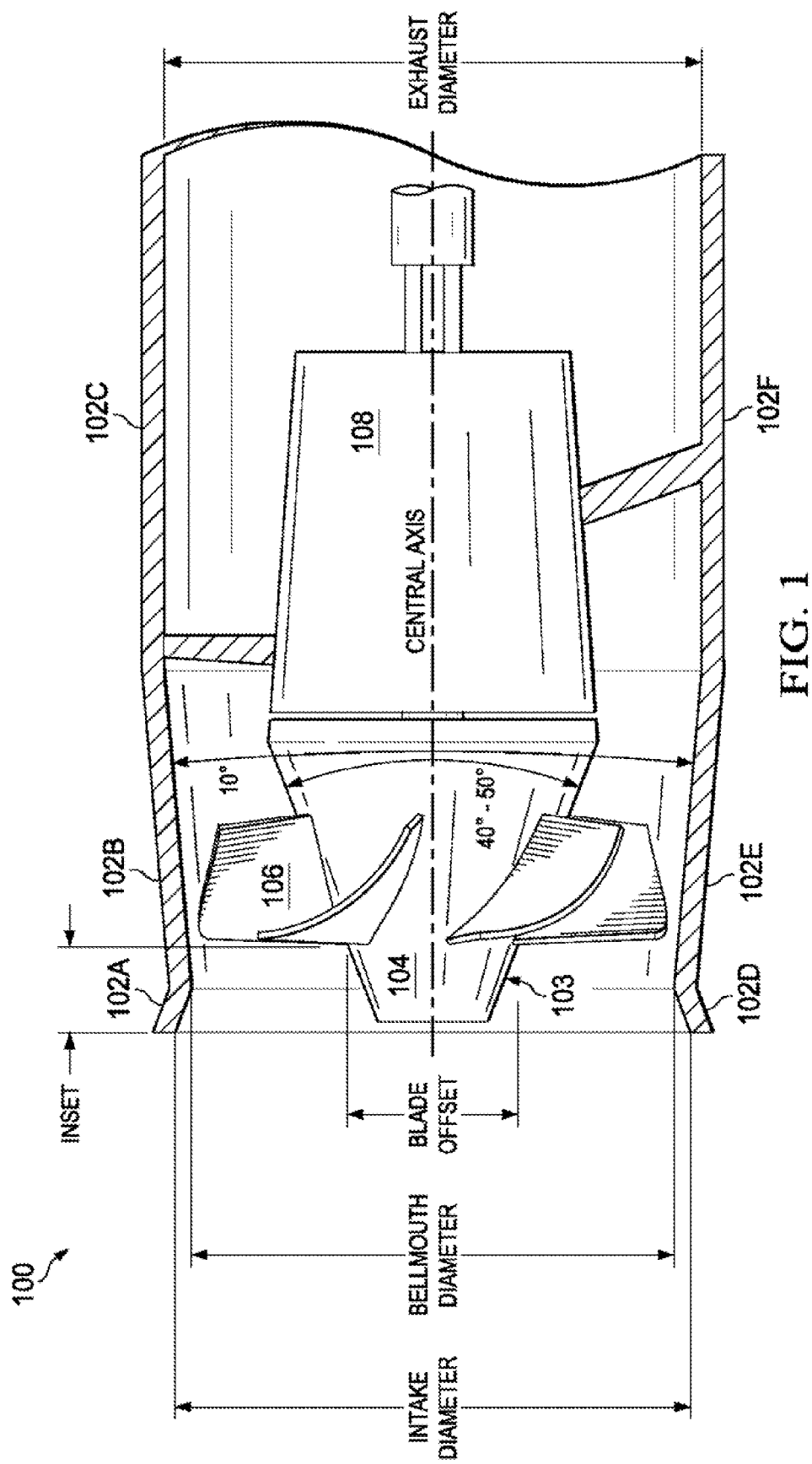
FIG. 1 illustrates a cross-section of a mixed-flow ducted fan in accordance with an embodiment of the disclosure.

FIG. 1 shows a cross-section of a mixed-flow ducted fan 100 in accordance with an embodiment of the disclosure. As shown in FIG. 1, the mixed-flow ducted fan 100 comprises an annular duct 102 (illustrated as parts 102A-102F) having a duct inlet with an intake diameter that is larger than a bellmouth diameter. The annular duct 102 also comprises a duct outlet with an exhaust diameter that is larger than the bellmouth diameter.

Various sections of the annular duct 102 are shown as sections 102A-102F. Duct sections 102A and 102D are lip sections or bell-curve sections that reduce the duct diameter from an intake diameter to a bellmouth diameter. Duct sections 102B and 102E extend from duct sections 102A and 102D respectively to increase the duct diameter from the bellmouth diameter to the exhaust diameter. In accordance with at least some embodiments, the increasing duct diameter between the bellmouth diameter and the exhaust diameter is linear (i.e., the shape of the annular duct 102 in the section corresponding to duct sections 1026 and 102E is a conical frustum). Thus, duct section 102B increases radially with respect to the central axis in a linear manner from duct section 102A to duct section 102C. Likewise, duct section 102E increases radially with respect to the central axis in a linear manner from duct section 102D to duct section 102F. In at least some embodiments, the angle between duct sections 102B and 102E is approximately 10°.

The duct sections 102C and 102F extend from duct sections 102B and 102E respectively until terminating at a duct outlet. In accordance with at least some embodiments, the duct sections 102C and 102F maintain the exhaust diameter while extending axially with respect to the central axis (i.e., the shape of the annular duct 102 in the portion corresponding to duct sections 102C and 102F is cylindrical).

As shown in FIG. 1, the ducted fan 100 comprises a propeller 103 having a hub 104 and blades 106 that extend radially from the hub 104. The hub 104 is coupled to a stator 108 that is braced within the annular duct 102. In at least some embodiments, the diameter of the hub 104 increases linearly as the annular duct 102 diameter increases linearly from the bellmouth diameter to the exhaust diameter (i.e., the shape of the hub 104 is conical frustum or partial conical frustum). The angle between opposing sides of the hub 104 that extend radially with respect to the central axis towards the duct exhaust may be, for example, between 40° to 50°. Accordingly, in some embodiments, the linearly increasing diameter portion of the hub 104 is angled more than the linearly increasing diameter portion of the annular duct 102 between the bellmouth diameter and the exhaust diameter (e.g., 40° to 50° compared to 10°).

In accordance with at least some embodiments, certain dimensions of the mixed-flow ducted fan 100 may be determined with respect to a desired fan size. For simplicity, the fan size may correspond to an exhaust diameter ("X"). In such embodiments, the bellmouth diameter is approximately 0.89*X, the blade inset (i.e., the minimal distance from the duct inlet where leading edges of the blades 106 begin extending from the hub 104) is approximately 0.20*X, the blade offset (i.e., the minimal radial distance between blades 106 extending from the hub 104) is approximately 0.36*X, and each bell mouth section (i.e. the curved arc sections corresponding to the duct sections 102A and 102D) have approximately a 0.14*X radius.

Figure 2A:
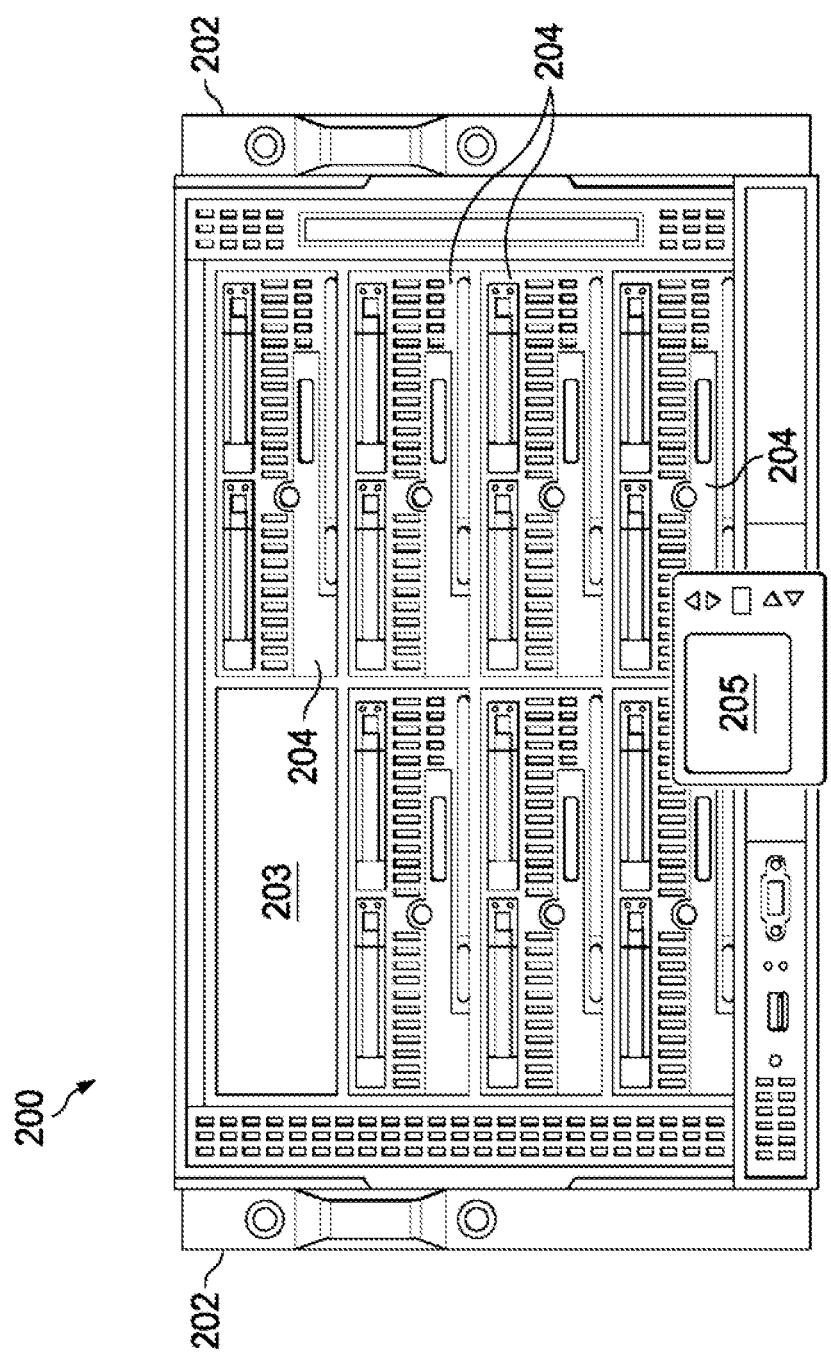
FIGS. 2A-2B illustrate a server rack architecture in accordance with an embodiment of the disclosure.
Figure 2B:
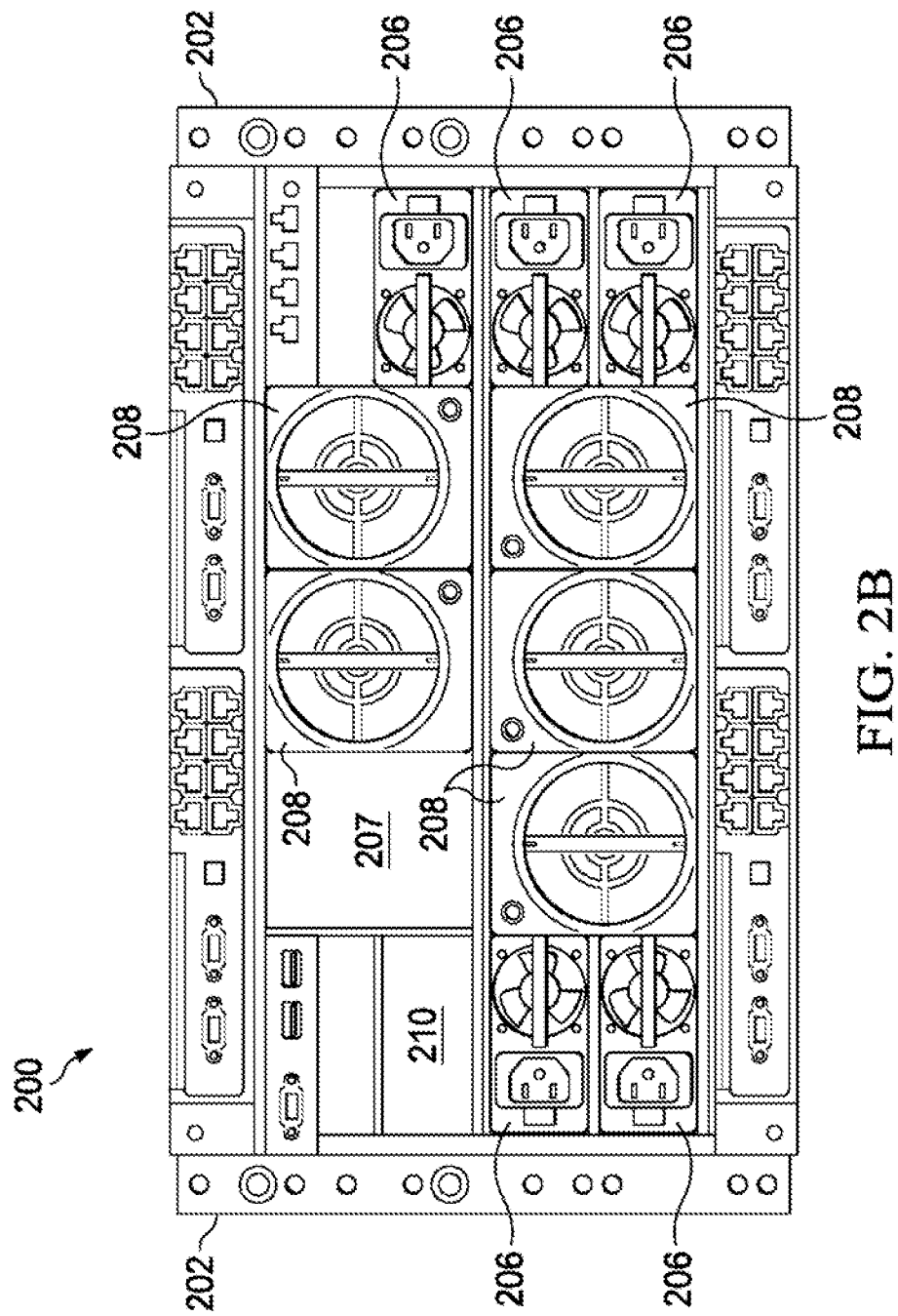
Figure 7:
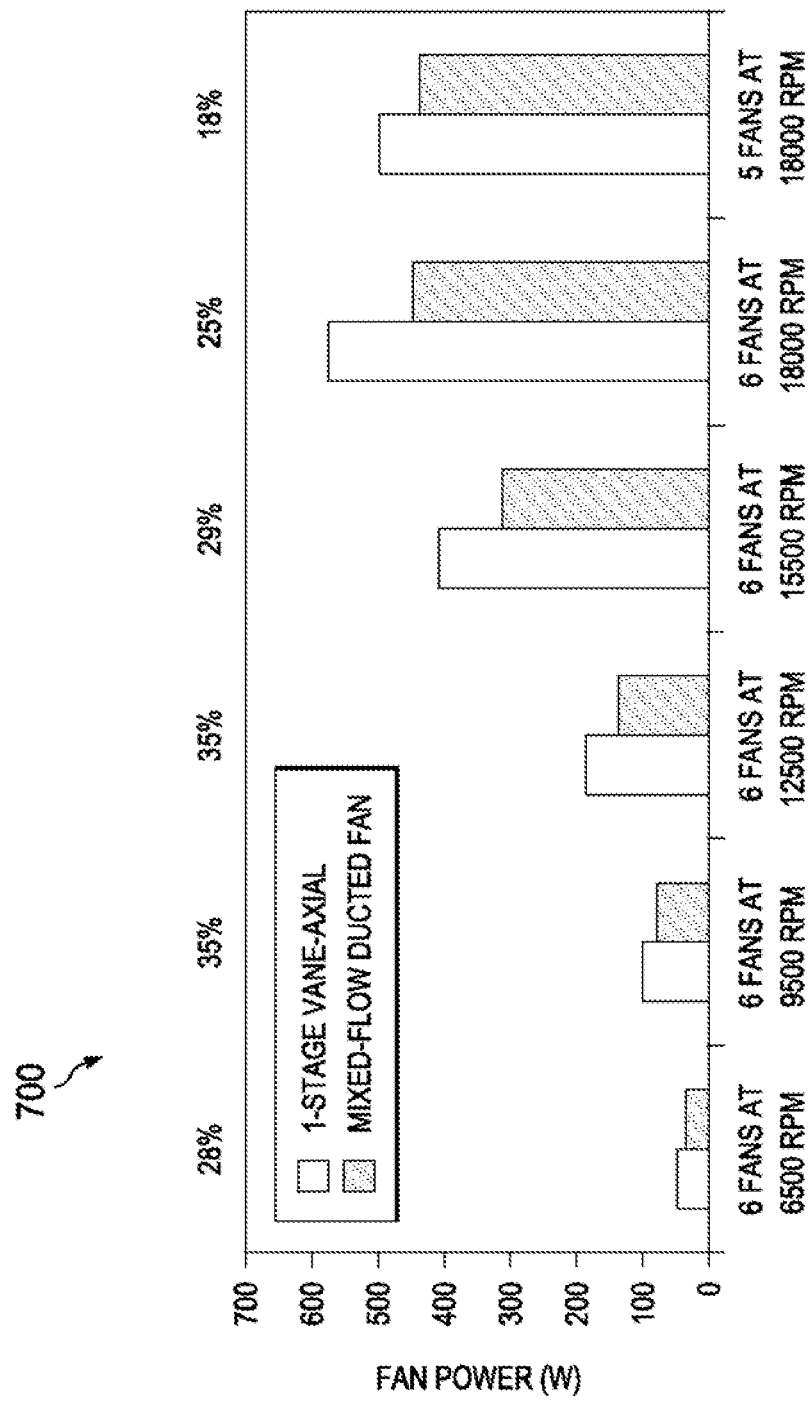
FIG. 7 illustrates a comparative power consumption chart in accordance with an embodiment of the disclosure.

In accordance with at least some embodiments, the mixed-flow ducted fan 100 is part of a mixed-flow ducted fan unit. For example, the mixed-flow ducted fan unit may be compatible with a server rack fan bay. FIGS. 2A-2B illustrate a server rack architecture 200 in accordance with an embodiment of the disclosure. More specifically, FIG. 2A illustrates a front-side view of the server rack architecture 200 and FIG. 2B illustrates a back-side view of the server rack architecture 200. As shown in FIG. 2A, the server rack architecture 200 comprises a chassis 202 with a plurality of resource unit bays 203. In FIG. 2A, 7 of 8 resource unit bays 203 are occupied by resource units 204 (e.g., blades). The server rack architecture 200 also comprises a control/information interface 205. In FIG. 2B, the chassis 202 is shown to comprise a plurality of power supply bays 210 and a plurality of fan unit bays 207. More specifically, 5 of 6 fan unit bays 207 are occupied by fan units 208 and 5 of 6 power supply bays 210 are occupied by power supplies 206. In accordance with at least some embodiments, each of the fan units 208 comprises a mixed-flow ducted fan 100. In FIGS. 2A-2B, the number of installed resource units 204, power supply units 206, and fan units 208 may vary.

Figure 3A:
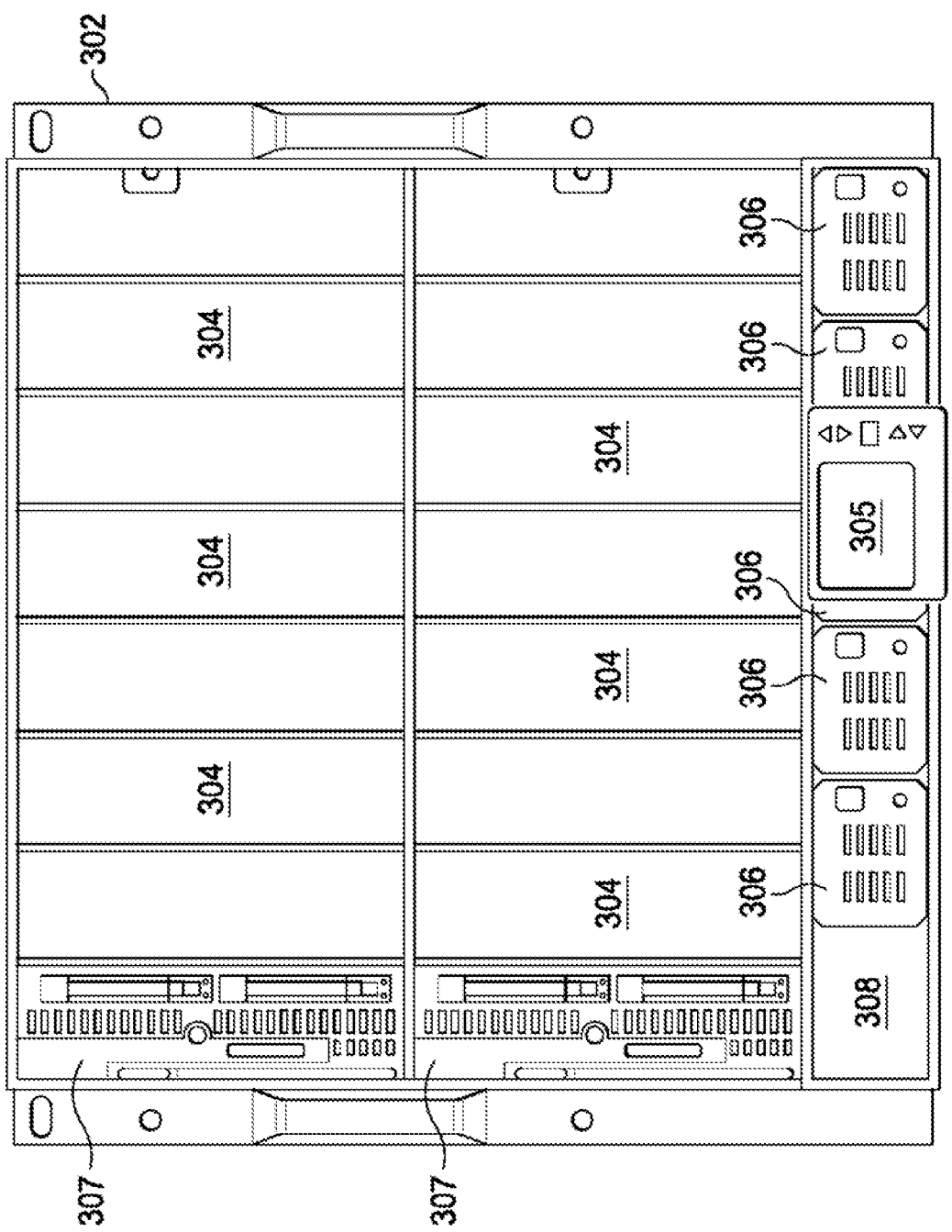
FIGS. 3A-3B illustrate another server rack architecture in accordance with an embodiment of the disclosure.
Figure 3B:
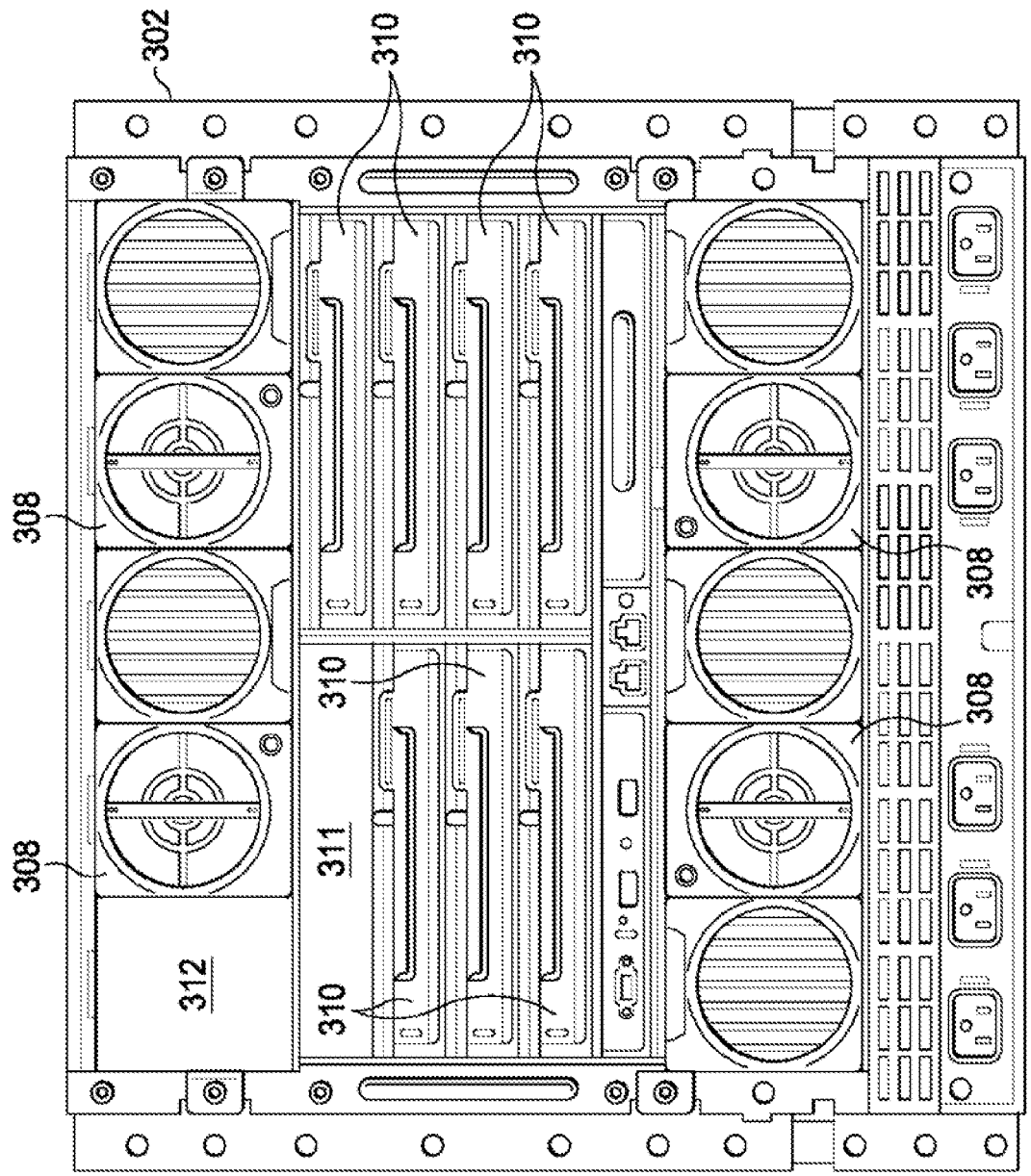

FIGS. 3A-3B illustrate another server rack architecture 300 in accordance with an embodiment of the disclosure. More specifically, FIG. 3A illustrates a front-side view of the server rack architecture 300 and FIG. 3B illustrates a back-side view of the server rack architecture 300. As shown in FIG. 3A, the server rack architecture 300 comprises a chassis 302 with a plurality of resource unit bays 304 and a plurality of power supply bays 308. In FIG. 3A, 2 of 16 resource unit bays 304 are occupied by resource units 307 (e.g., blades) and 5 of 6 power supply bays 308 are occupied by power supplies 306. The server rack architecture 300 also comprises a control/information interface 305. In FIG. 3B, the chassis 302 is shown to comprises a plurality of interconnect bays 311 and a plurality of fan unit bays 312. More specifically, in FIG. 3B, 7 of 8 interconnect bays 311 are occupied by interconnect units 310 and 9 of 10 fan unit bays 312 are occupied by fan units 308. In accordance with at least some embodiments, each of the fan units 308 comprises a mixed-flow ducted fan 100. In FIGS. 3A-3B, the number of installed resource units 307, power supply units 306, and fan units 308 may vary.

Figure 4A:
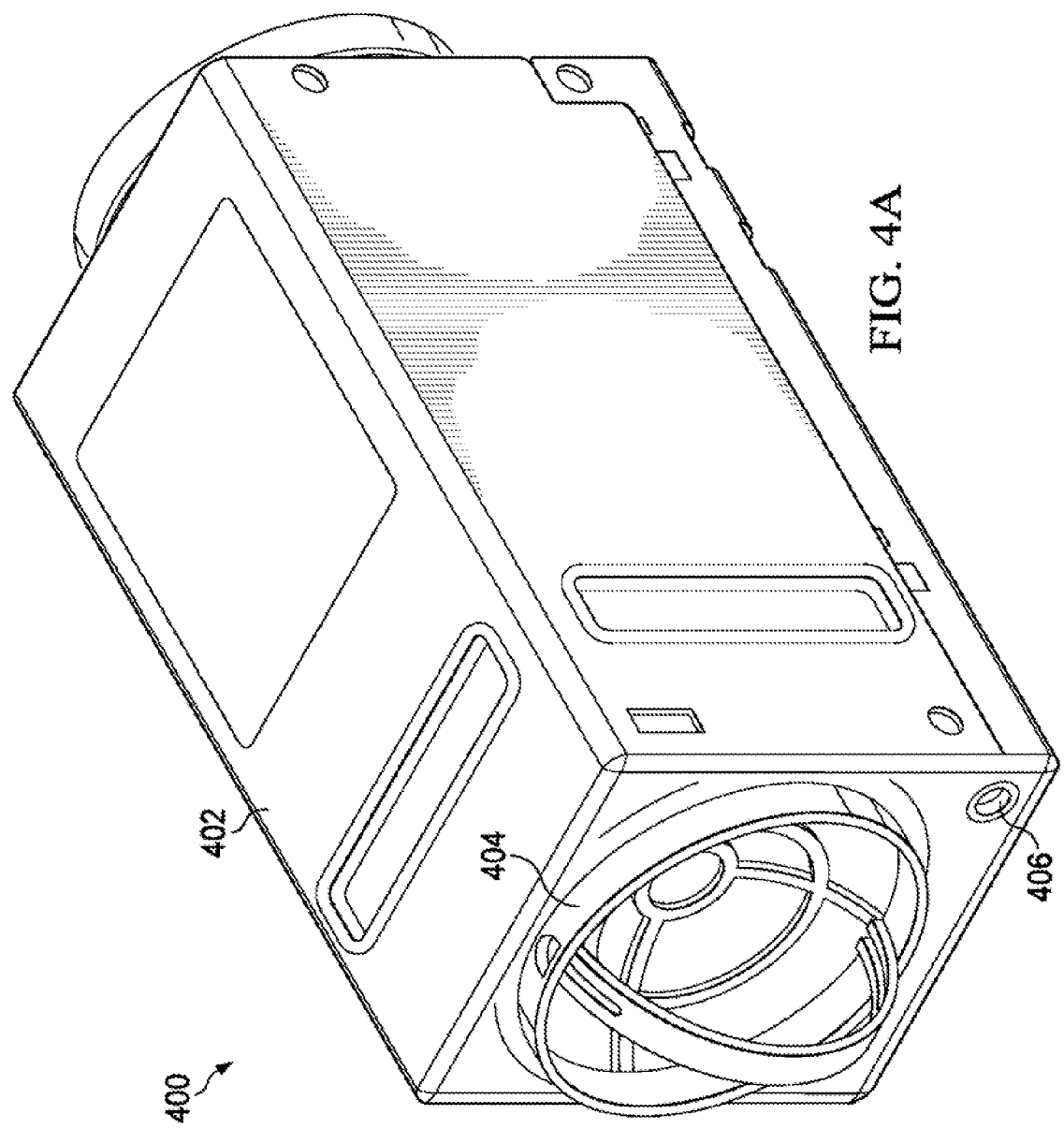
FIGS. 4A-4B illustrate a ducted fan unit compatible with the server rack architectures of FIGS. 3A-3B and 4A-4B.
Figure 4B:
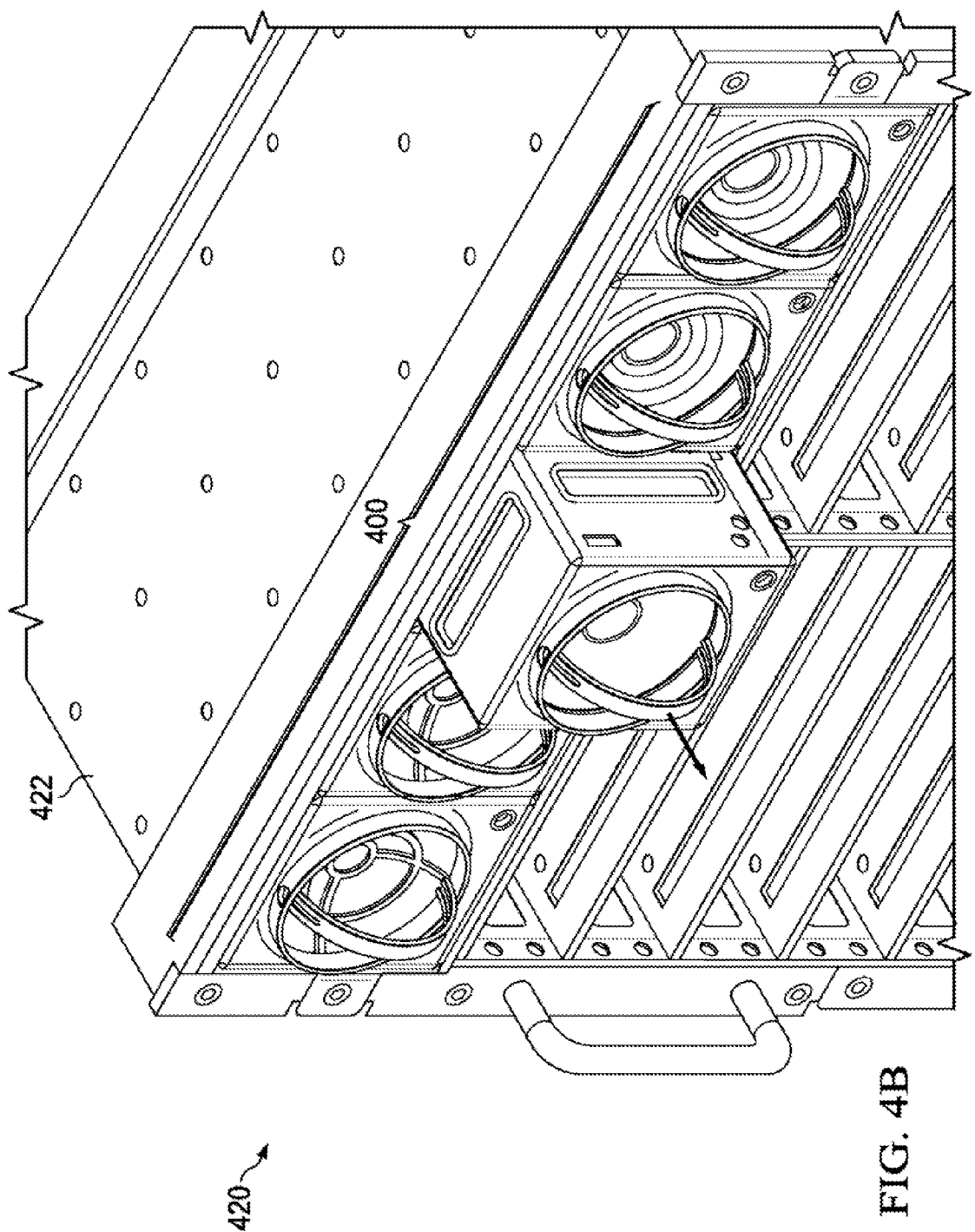

FIGS. 4A-4B illustrate a ducted fan unit 400 compatible with the server rack architectures of FIGS. 3A-3B and 4A-4B. As shown in FIG. 4A, the ducted fan unit 400 comprises an enclosure 402 compatible with the fan bays of either of the server rack architectures 200 or 300 (i.e., fan bays 207 or 312). The mixed-flow ducted fan 100 is fitted within the enclosure 402. The ducted fan unit 400 also may comprise a status indicator 406 (e.g., an light-emitting diode (LED)) that indicates whether the ducted fan unit 400 is working or failed, or whether information regarding the ducted fan unit 400 is being displayed by a display screen (e.g., the control/information interface 205 or 305). The ducted fan unit 400 also may comprise a handle 404 that enables locking and unlocking the ducted fan unit 400 in its installed position.

FIG. 4B shows a server rack 420 in which five ducted fan units 400 are installed in a chassis 422. Each of the ducted fans units 400 may be selectively removed or replaced as needed. For example, in FIG. 4B, the middle ducted fan unit is shown being removed from the chassis 422.

Figure 5:
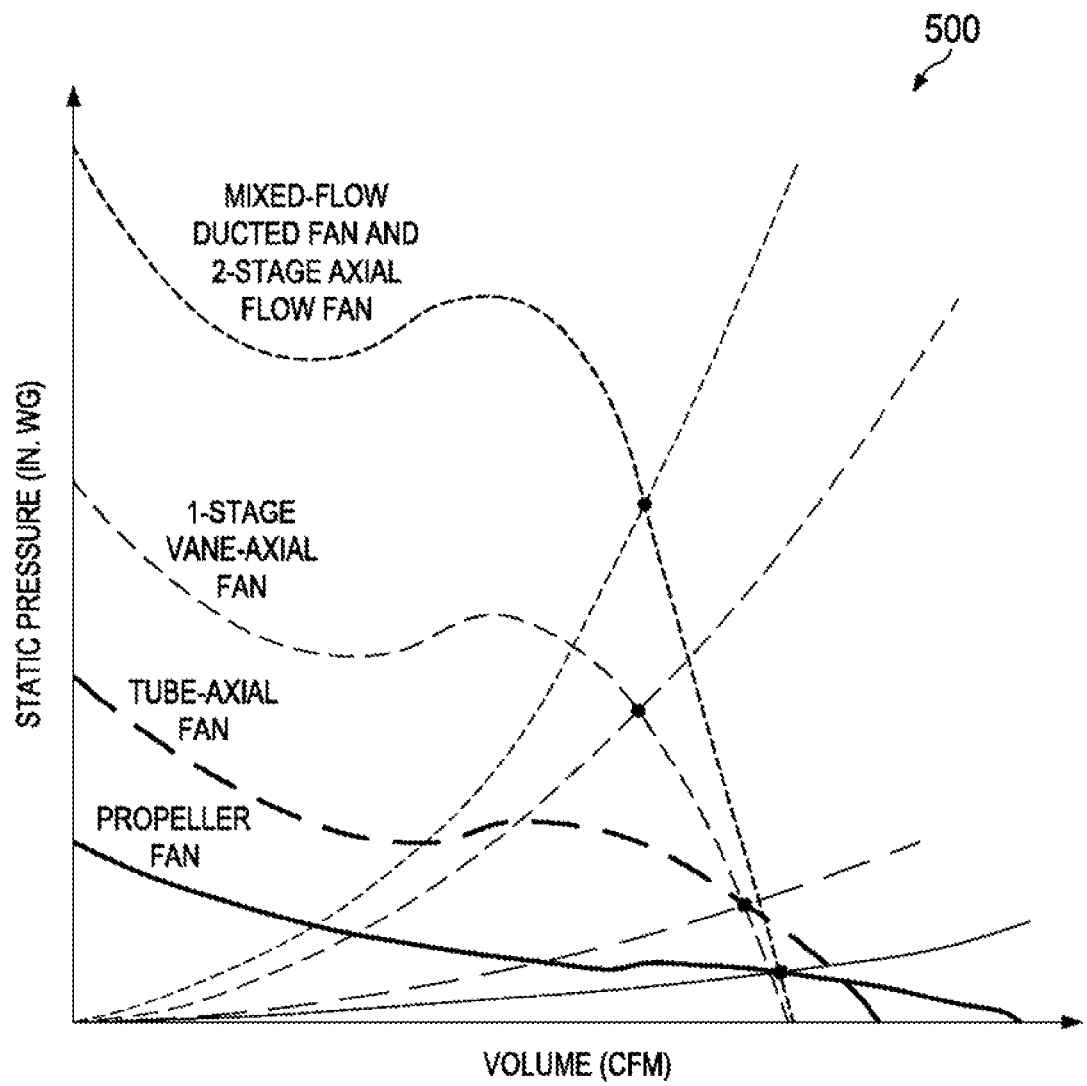
FIG. 5 illustrates a comparative flow performance chart for a mixed-flow ducted fan in accordance with an embodiment of the disclosure.

FIG. 5 illustrates a comparative flow performance chart 500 for the mixed-flow ducted fan 100 in accordance with an embodiment of the disclosure. In the chart 500, the flow performance of the mixed-flow ducted fan 100 is determined as function of volume (in cubic feet per minute (cfm)) and static pressure (inches water gauge). As shown, the flow performance of the mixed-flow ducted fan 100 is approximately the same as a 2-stage axial flow fan. Further, the flow performance of the mixed-flow ducted fan 100 is greater than the flow performance for a 1-stage vane-axial fan, a tube-axial fan and a standard propeller fan. Although the flow performance of the mixed-flow ducted fan 100 is shown to be approximately equal to that of a 2-stage axial flow fan, the mixed-flow ducted fan 100 provides benefits such as greater efficiency and less noise compared to a 2-stage axial flow fan.

Figure 6:
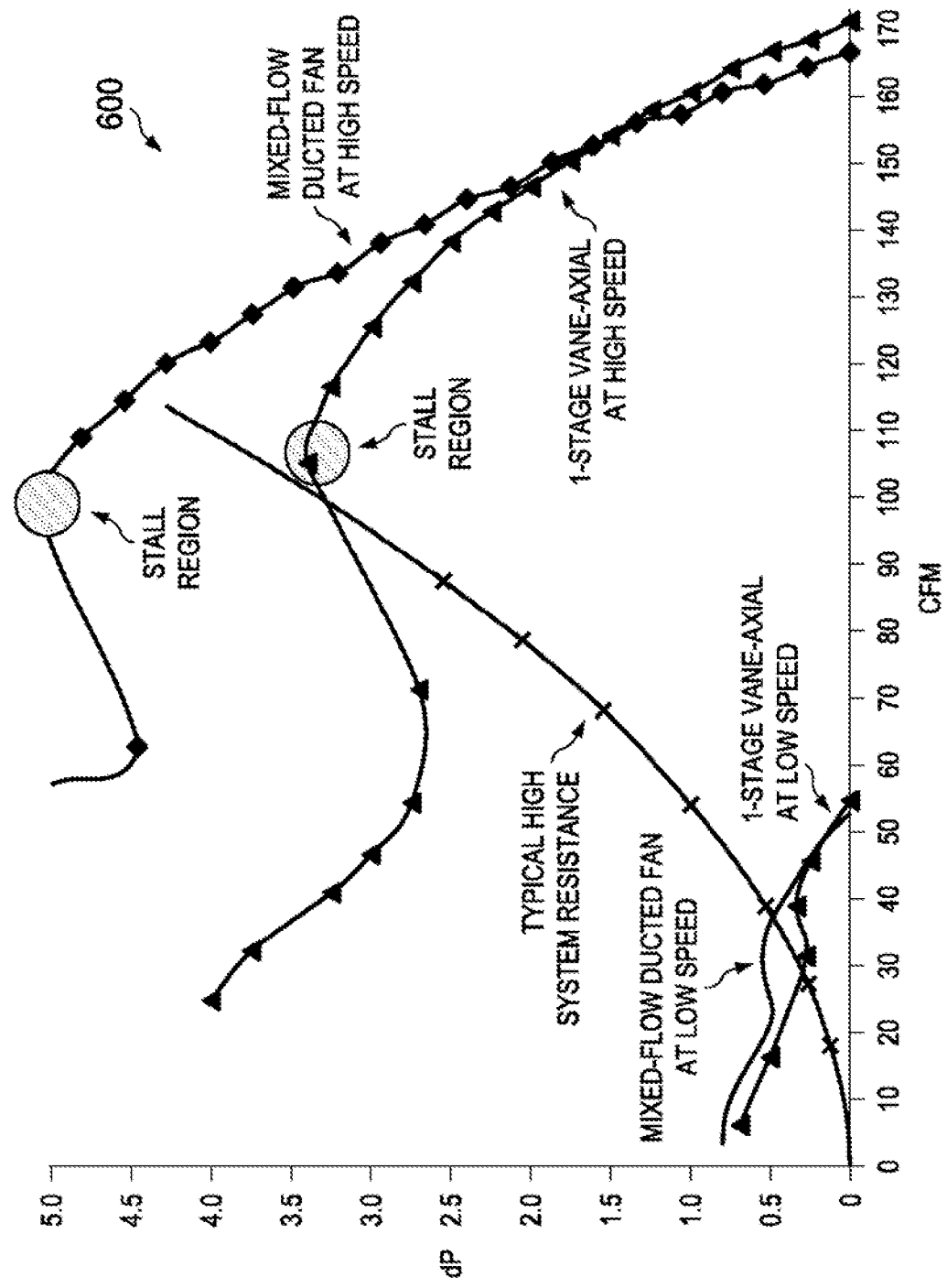
FIG. 6 illustrates a comparative pressure performance chart for a mixed-flow ducted fan in accordance with an embodiment of the disclosure.

FIG. 6 illustrates a comparative pressure performance chart 600 for the mixed-flow ducted fan 100 in accordance with an embodiment of the disclosure. In the chart 600, the pressure performance of the mixed-flow ducted fan 100 is determined as function of volume (in cubic feet per minute (cfm)) and differential pressure (dP). In FIG. 6, the pressure performance of the mixed-flow ducted fan 100 is compared to the pressure performance of a 1-stage vane-axial fan. At low speed, the mixed-flow ducted fan 100 performs approximately equal to the 1-stage vane-axial fan until about 0.25 dP. Above 0.25 dP, the mixed-flow ducted fan 100 performs better than the 1-stage vane-axial fan at low speed. As shown, the stall point of the mixed-flow ducted fan 100 at low speed is adjusted compared to the stall point of the 1-stage vane-axial fan to avoid a high-resistance curve representative of the system environment in which the mixed-flow ducted fan 100 is beneficial (e.g., the architectures 200 and 300). At high speed, the mixed-flow ducted fan 100 performs slightly worse than the 1-stage vane-axial fan until about 1.5 dP. Above 1.5 dP, the mixed-flow ducted fan 100 performs better than the 1-stage vane-axial fan at high speed. As shown, the stall point of the mixed-flow ducted fan 100 at high speed is adjusted compared to the stall point of the 1-stage vane-axial fan to avoid a high-resistance curve representative of the environment of systems in which the mixed-flow ducted fan is beneficial (e.g., the architectures 200 and 300).

FIG. 7 illustrates a comparative power consumption chart 700 in accordance with an embodiment of the disclosure. In the chart 700, the power consumption performance is shown by the number of Watts consumed for different fan sets and fan speeds. In FIG. 7, mixed-flow ducted fan sets are compared to 1-stage vane-axial fan sets. As shown, mixed-flow ducted fan sets (5 or 6 fans) reduce power consumption (between 18% to 35%) at various speeds compared to 1-stage vane-axial fan sets. The chart 700 corresponds to, for example, a power consumption analysis for the server rack architecture 200 of FIGS. 2A-2B, where up to 6 fans units are employed.

Figure 8:
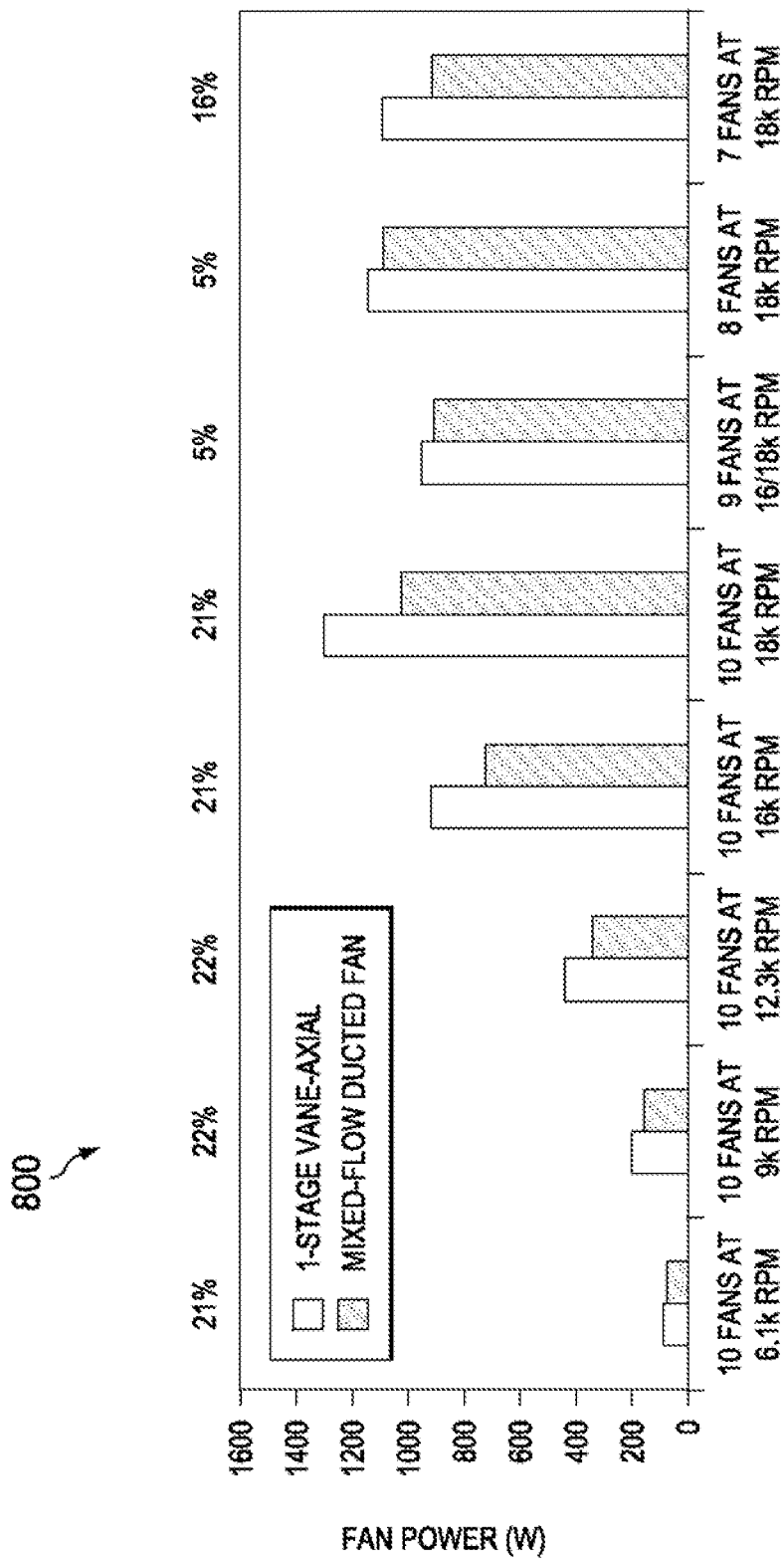
FIG. 8 illustrates another comparative power consumption chart in accordance with an embodiment of the disclosure.

FIG. 8 illustrates another comparative power consumption chart 800 in accordance with an embodiment of the disclosure. In the chart 800, the power consumption performance is shown by the number of Watts consumed for different fan sets and fan speeds. In FIG. 8, mixed-flow ducted fan sets are compared to 1-stage vane-axial fan sets. As shown, mixed-flow ducted fan sets (7 to 10 fans) reduce power consumption (between 5% to 22%) at various speeds compared to 1-stage vane-axial fan sets. The chart 800 corresponds to, for example, a power consumption analysis for the server rack architecture 300 of FIGS. 3A-3B, where up to 10 fans units are employed.

The above discussion is meant to be illustrative of the principles and various embodiments of the present invention. Numerous variations and modifications will become apparent to those skilled in the art once the above disclosure is fully appreciated. It is intended that the following claims be interpreted to embrace all such variations and modifications.

What is claimed is:

1. A computer system, comprising:
an enclosure configured to hold at least one resource unit; and
a plurality of mixed-flow ducted fans units selectively attached to the enclosure, wherein each mixed-flow ducted fan unit comprises a duct having an intake diameter, a bellmouth diameter, and an exhaust diameter, wherein the bellmouth diameter is less than the intake diameter and the exhaust diameter,
wherein each duct has a linearly increasing diameter portion between the bellmouth diameter and the exhaust diameter and wherein the exhaust diameter is approximately equal to the intake diameter,
wherein each duct has a linearly decreasing diameter portion between the intake diameter and the bellmouth diameter, and
wherein the linearly decreasing diameter portion and the linearly increasing diameter portion of each duct intersect at the bellmouth diameter.

2. The computer system of claim 1, wherein the enclosure is a server rack chassis with a plurality of resource unit bays and with a plurality of fan bays compatible with the plurality of mixed-flow ducted fans units.

3. The computer system of claim 2, wherein the plurality of fans bays are on a rear-side of the server rack chassis and wherein installation of mixed-flow ducted fan units into the plurality of fan bays is customizable.

4. The computer system of claim 1, wherein each mixed-flow ducted fan unit comprises a propeller inset in the duct between the bellmouth diameter and the exhaust diameter, wherein the propeller comprises a hub with a linearly increasing diameter portion.

5. The computer system of claim 4, wherein the linearly increasing diameter portion of the hub is angled more than a linearly increasing diameter portion of the duct between the bellmouth diameter and the exhaust diameter.

6. A mixed-flow ducted fan comprising:
a duct having an intake diameter, a bellmouth diameter, and an exhaust diameter, wherein the bellmouth diameter is less than the intake diameter and the exhaust diameter; and a propeller inset within the duct between the bellmouth diameter and the exhaust diameter,
wherein the duct has a linearly increasing diameter portion between the bellmouth diameter and the exhaust diameter and wherein the exhaust diameter is approximately equal to the intake diameter,
wherein the duct has a linearly decreasing diameter portion between the intake diameter and the bellmouth diameter, and
wherein the linearly decreasing diameter portion and the linearly increasing diameter portion of the duct intersects at the bellmouth diameter.

7. The mixed-flow ducted fan of claim 6, wherein the linearly increasing diameter portion of the duct has an angle of approximately 10 degrees.

8. The mixed-flow ducted fan of claim 6, wherein the propeller comprises a hub with a linearly increasing diameter portion that is angled more than a linearly increasing diameter portion of the duct between the bellmouth diameter and the exhaust diameter.

9. The mixed-flow ducted fan of claim 8, wherein opposing sides of the hub corresponding to the linearly increasing diameter portion of the hub form an angle of approximately 40-50 degrees.

10. The mixed-flow ducted fan of claim 6, wherein if the exhaust diameter is X, the bellmouth diameter is approximately 0.89*X.

11. The mixed-flow ducted fan of claim 6, wherein if the exhaust diameter is X, a minimum propeller inset distance from an intake of the duct is approximately 0.2*X.

12. The mixed-flow ducted fan of claim 6, wherein the mixed-flow ducted fan is part of a fan unit that is compatible with a server rack fan bay.

13. The mixed-flow ducted fan of claim 6, wherein a stall region of the mixed-flow ducted fan occurs at a higher pressure compared to a stall region of a 1-stage vane-axial fan.

* * * * *